United States Patent
Ando et al.

[11] Patent Number: 6,111,322
[45] Date of Patent: Aug. 29, 2000

[54] SEMICONDUCTOR DEVICE AND MANUFACTURING METHOD THEREOF

[75] Inventors: Hideko Ando, Hamura; Hiroshi Kikuchi, Ome; Toshihiko Sato, Sayama; Tetsuya Hayashida, Hinode-machi, all of Japan

[73] Assignee: Hitachi, Ltd., Tokyo, Japan

[21] Appl. No.: 08/858,695

[22] Filed: May 19, 1997

[30] Foreign Application Priority Data

May 20, 1996 [JP] Japan ..................................... 8-124156

[51] Int. Cl.⁷ ........................... H01L 23/48; H01L 23/52; H01L 29/40
[52] U.S. Cl. ........................... 257/778; 257/706; 257/707
[58] Field of Search .................................... 257/778, 786, 257/781, 706, 707, 797, 705, 783

[56] References Cited

U.S. PATENT DOCUMENTS

| | | |
|---|---|---|
| 3,871,015 | 3/1975 | Lin et al. . |
| 5,276,289 | 1/1994 | Satoh et al. . |
| 5,455,457 | 10/1995 | Kurokawa ................ 257/706 |
| 5,533,256 | 7/1996 | Call et al. . |
| 5,569,960 | 10/1996 | Kumazawa et al. . |
| 5,585,671 | 12/1996 | Negesh et al. ............ 257/778 |
| 5,598,036 | 1/1997 | Ho . |
| 5,705,850 | 1/1998 | Ashiwake et al. ........ 257/706 |
| 5,751,060 | 5/1998 | Laine et al. .............. 257/783 |
| 5,866,951 | 2/1999 | Gademann et al. . |
| 5,905,636 | 5/1999 | Baska et al. . |

OTHER PUBLICATIONS

Electronic Material, Apr. 1996, pp. 14–19.

*Primary Examiner*—Sheila V. Clark
*Attorney, Agent, or Firm*—Mattingly, Stanger & Malur, P.C.

[57] ABSTRACT

An electrically reliable heat radiating package provided with a ball grid array (BGA) structure and a method of manufacturing the package are disclosed.

A semiconductor chip is mounted on one surface of a ceramic wiring board via first solder bump electrodes and resin is filled in a gap area between the one surface of the wiring board and the principal surface of the semiconductor chip. A heat diffusing plate formed in a larger plane size than that of the semiconductor chip by aluminum nitride is arranged on the rear surface opposite to the principal surface of the semiconductor chip and soldered.

Further, a radiating fin made of aluminum is provided on the heat diffusing plate and struck via silicone rubber in which a thermally conductive filler is includes.

Further, the above first solder bump electrodes and second solder bump electrodes with a lower melting point than that of the solder used for the above soldering are formed on the rear surface of the above ceramic wiring board, and the above BGA package provided with a heat radiating structure is formed.

This BGA package is mounted on a glass epoxy wiring board at low temperature.

4 Claims, 15 Drawing Sheets

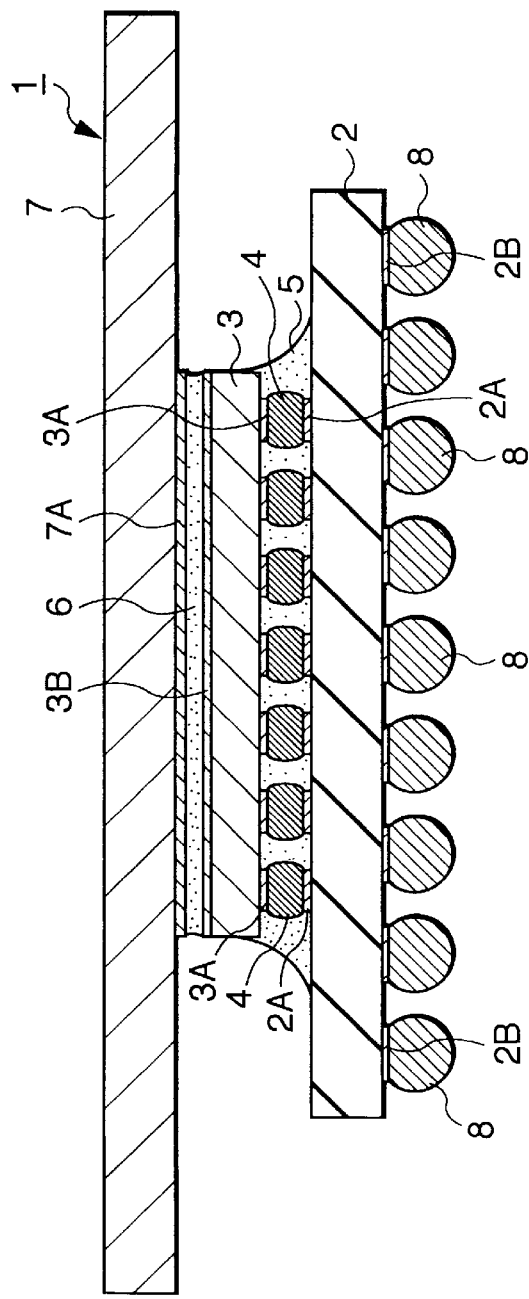
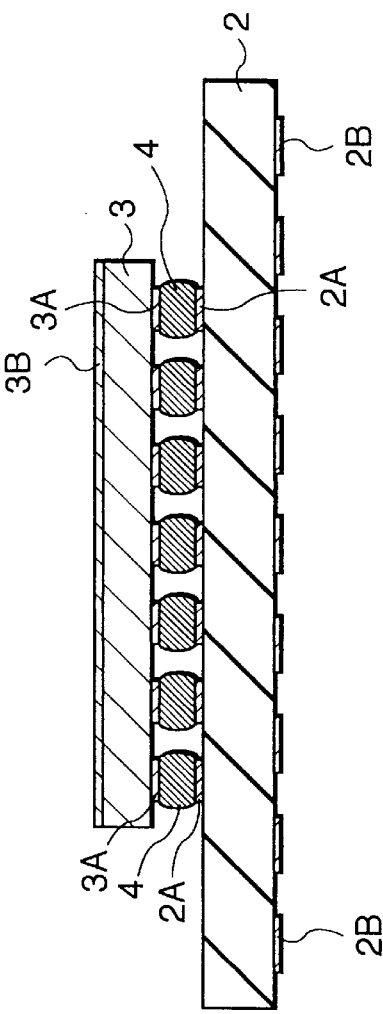

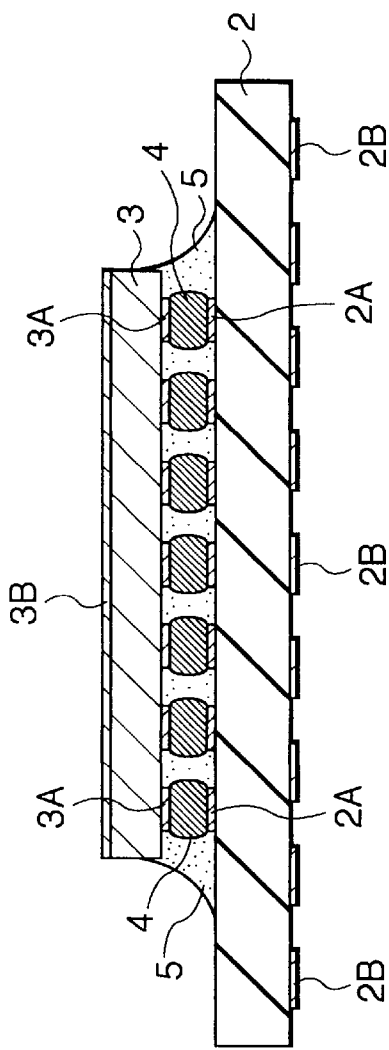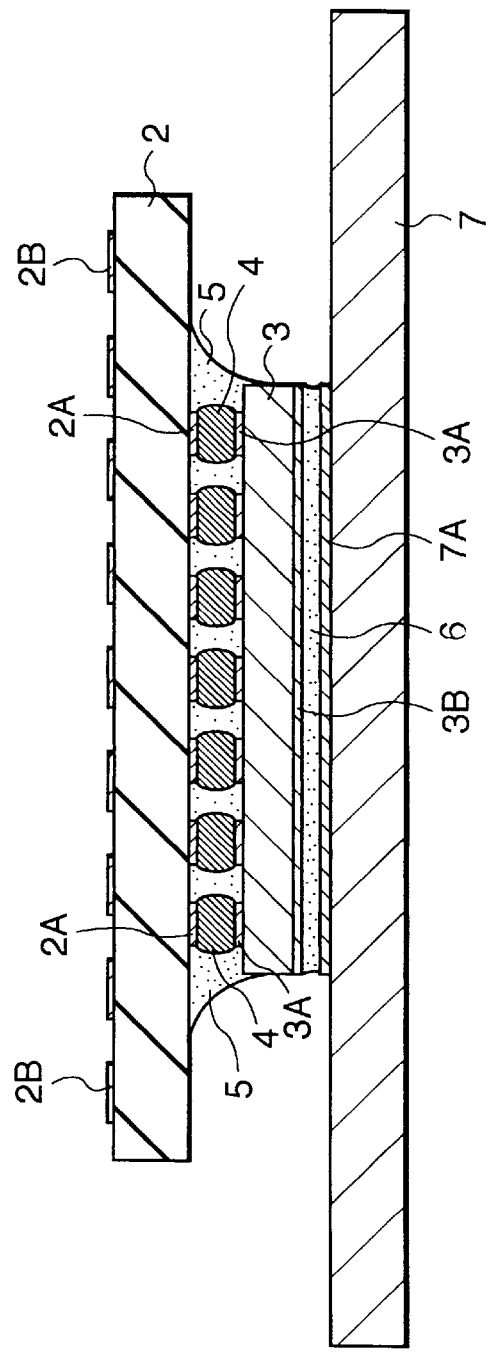

SEMICONDUCTOR DEVICE AND MANUFACTURING METHOD THEREOF

BACKGROUND OF THE INVENTION

The present invention relates to a semiconductor device, and particularly relates to effective techniques applicable to a semiconductor device formed by mounting a semiconductor chip on one surface of a wiring board via a bump electrode and provided with a package structure in which resin is filled in a gap area between the one surface of the above wiring board and the principal surface of the above semiconductor chip.

A semiconductor device, formed by mounting a semiconductor chip on one surface of a wiring board via a bump electrode, and provided with a package structure in which resin is filled in a gap area between the one surface of the wiring board and the principal surface of the semiconductor chip, is developed as described on pages 14 to 19 of the April issue of Electronic Material published in 1996 by Industrial Research Association, for example. As the mechanical strength of the resin filled in the gap area between the one surface of the wiring board and the principal surface of the semiconductor chip can compensate that of the bump electrode in this semiconductor device, the bump electrode can be prevented from being damaged due to the difference in thermal expansion coefficient between the wiring board and the semiconductor chip. As the rear surface (opposite to the principal surface of the semiconductor chip) and the side face are exposed in this semiconductor device and the area in which the semiconductor chip is exposed to the air is large, the efficiency of heat radiation in which heat generated from the semiconductor chip is radiated in the air is higher, compared with a semiconductor device in which the semiconductor chip is sealed in a seal box, and compared with a semiconductor device which is mounted in a cavity formed by a package.

SUMMARY OF THE INVENTION

In the above semiconductor device, the heating value of heat generated from the semiconductor chip tends to be increased as the performance of a circuit system mounted on a semiconductor chip is enhanced. In the meantime, the plane size of a semiconductor chip tends to be large-sized as the performance of the circuit system mounted on the semiconductor chip is enhanced. However, the ratio in which the plane size of the semiconductor chip is increased is smaller, compared with the ratio in which the heating value of the semiconductor chip is increased. That is, the area in which the semiconductor chip is exposed to the air is not increased in proportion to the heating value of the semiconductor chip. Therefore, the efficiency of heat radiation in which heat generated from the semiconductor chip is radiated in the air is deteriorated.

The object of the present invention is to provide a technique which enables enhancing the efficiency of heat radiation of a semiconductor device provided with a package structure in which a semiconductor chip is mounted on one surface of a wiring board via a bump electrode and resin is filled in a gap area between the one surface of the wiring board and the principal surface of the semiconductor chip.

The above and other objects and new characteristics of the present invention will be clarified by the description in this specification and the attached drawings.

The brief description of the summary of the typical inventions disclosed in the present invention is as follows:

In a semiconductor device provided with a package structure in which a semiconductor chip is mounted on one surface of a wiring board via a bump electrode and resin is filled in a gap area between the one surface of the wiring board and the principal surface of the semiconductor chip, an aluminum nitride plate member formed in a larger plane size compared with that of the semiconductor chip, is arranged on the rear surface opposite to the principal surface of the semiconductor chip, and a fixing area on the one surface of the plate member opposite to the rear surface of the semiconductor chip is fixed on the rear surface of the semiconductor chip via solder. Further, a radiating fin made of aluminum is arranged on the above plate member via a thermally conductive elastic body or grease.

According to the above means, the plate member formed so that the outside size is larger than that of the semiconductor chip has a larger area in which the plate member is exposed to the air, compared with the exposed area of the semiconductor chip. The thermal conductivity of the plate member formed by aluminum nitride is high. Thermal conductivity from the semiconductor chip to the plate member is high in a fixed part between the rear surface of the semiconductor chip and one surface of the plate member via solder. Therefore, heat generated from the semiconductor chip is efficiently transmitted from the semiconductor chip to the plate member and the heat transmitted to the plate member is efficiently diffused flatly. Further, as the heat diffused on the plate member is efficiently transmitted in the air by a radiating fin made of aluminum, the efficiency of heat radiation in which heat generated from the semiconductor chip is radiated in the air can be enhanced.

As the area other than the area in which the plate member is fixed on the rear surface of the semiconductor chip is exposed to the outside, the exposed area can be increased, compared with a case that a plate member is fixed on a wiring board and a case that a plate member is fixed on a package.

As the difference in a thermal expansion coefficient between the plate member made of aluminum nitride and the semiconductor chip consisting of a silicon substrate is small, thermal stress generated due to the difference in the thermal expansion coefficient between the plate member and the semiconductor chip can be prevented from being generated even if the plate member is fixed on the rear surface of the semiconductor chip via solder.

As a plate made of aluminum nitride can be simply processed, for example cut by a machine, the cost can be reduced. Further, as a fin for increasing the heat radiating area is formed by aluminum, it can be cast, and a fin in a complicated shape can be obtained at a low cost.

BRIEF DESCRIPTION OF THE DRAWINGS

FIG. 1 is a sectional view showing the schematic constitution of a semiconductor device equivalent to an embodiment according to the present invention;

FIG. 2 is a sectional view for explaining a method of manufacturing the above semiconductor device;

FIG. 3 is a sectional view for explaining a method of manufacturing the above semiconductor device;

FIG. 4 is a sectional view for explaining a method of manufacturing the above semiconductor device;

DESCRIPTION OF THE PREFERRED EMBODIMENTS

Figure 5:
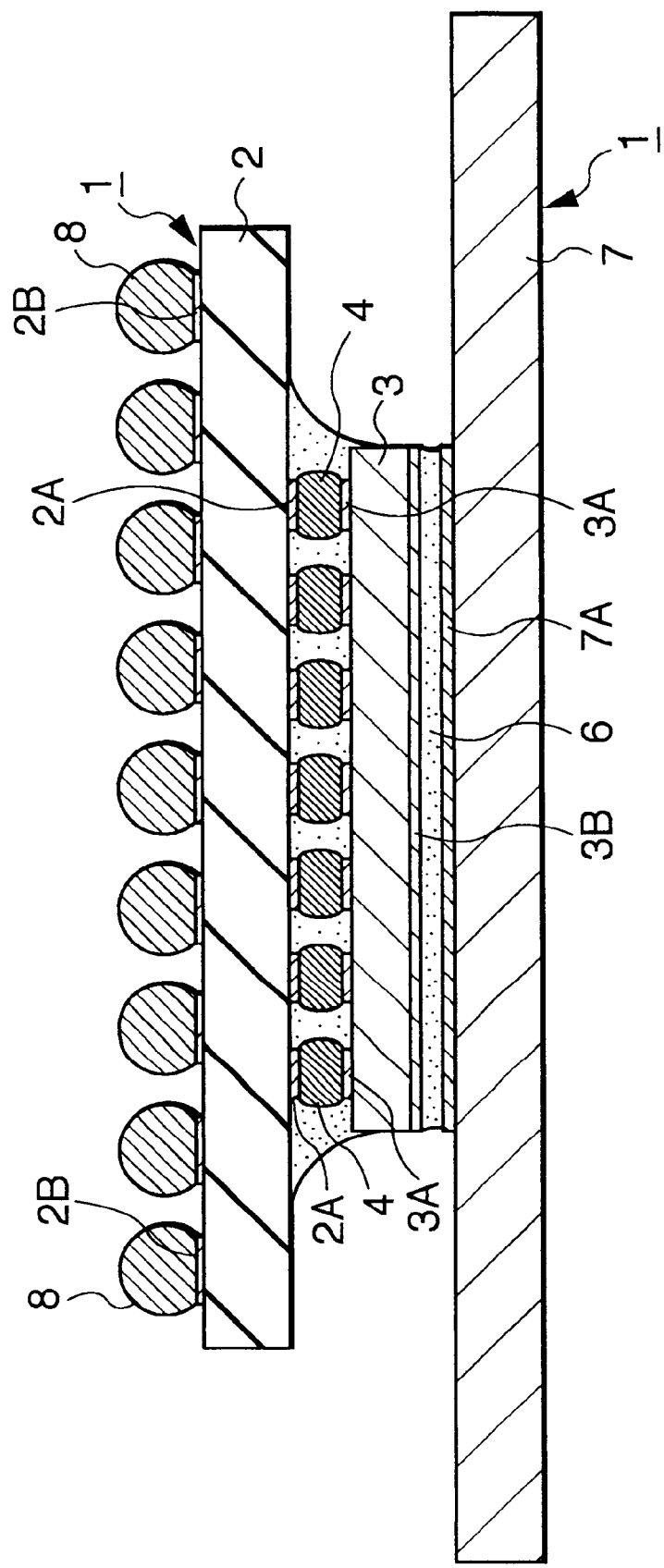
FIG. 5 is a sectional view for explaining a method of manufacturing the above semiconductor device.

Referring to the drawings, embodiments according to the present invention will be described in detail below.

In all drawings for explaining the embodiments according to the present invention, the same reference numbers are allocated to parts provided with the same function and the descriptions of such parts are not repeated.

First Embodiment

FIG. 1 is a sectional view showing the schematic constitution of a semiconductor device equivalent to a first embodiment according to the present invention.

As shown in FIG. 1, a semiconductor device 1 is constituted by mounting a semiconductor chip 3 on one surface (the mounting surface) of a wiring board 2 via bump electrodes 4 and provided with a package structure in which resin 5 is filled in a gap area between the one surface of the wiring board 2 and the principal surface of the semiconductor chip 3.

The plane shape of the above wiring board 2 is square for example. The wiring board 2 is constituted by a ceramic substrate made of aluminum oxide ($Al_2O_3$) for example. The heat-proof temperature of the wiring board 2 in this case is 1,000° C. or more and the wiring board has a thermal expansion coefficient of approximately $7 \times 10^{-6}[1/°C.]$. The wiring board 2 has external dimensions of 30 [mm] ×30 [mm] for example.

Plural electrode pads 2A are arranged on the one surface of the wiring board 2 and plural electrode pads 2B are arranged on the rear surface opposite to the one surface of the wiring board 2. These electrode pads 2A and 2B are respectively electrically connected via the wiring of the wiring board 2.

The plane shape of the above semiconductor chip 3 is square for example. The semiconductor chip 3 is mainly constituted by, for example, a silicon substrate and a wiring layer formed on the principal surface (the surface on which components are formed). The semiconductor chip 3 in this case has a thermal expansion coefficient of approximately $3.5 \times 10^{-6}[1/°C.]$. The semiconductor chip 3 is formed in a plane size of 10 [mm] ×10 [mm] for example.

A logic circuit system and a storage circuit system, or a circuit system combining the two, are mounted on the semiconductor chip 3. The performance of these circuit systems tends to be enhanced and the heating value of heat generated from the semiconductor chip 3 is increased in proportion to the enhancement of the performance of these circuit systems.

Plural external terminals 3A are arranged on the principal surface of the semiconductor chip 3. These plural external terminals 3A are formed on the surfaces of respective plural internal terminals formed in the uppermost wiring layer of wiring layers formed on the principal surface of a silicon substrate for example, though the substrate is not limited to a silicon substrate. These internal terminals are formed by an aluminum film or an aluminum alloy film for example.

The above plural external terminals 3A are respectively fixed to the plural electrode pads 2A arranged on the one surface of the wiring board 2 via the respective bump electrodes 4 and electrically and mechanically connected. That is, the semiconductor chip 3 is mounted on the one surface of the wiring board 2 according to a face-down method. The bump electrodes 4 are formed by, for example, metallic material with a melting point of approximately 320° C. and composed of 98.2% by weight of lead (Pb) and 1.8% by weight of tin (Sn).

The electrode pads 2A of the wiring board 2 and the external terminals 3A of the semiconductor chip 3 are formed by, for example, an underdeposited metallic film to secure high wettability between each of them and the bump electrodes 4. The electrode pads 2B of the wiring board 2 are also formed by, for example, an underdeposited metallic film to secure high wettability between them and the bump electrodes 8. These underdeposited metallic films are constituted by a laminated structure in which, for example, a chromium (Cr) film, a nickel (Ni) film and a gold (Au) film are laminated in order, though they are not limited to this structure.

The resin 5 filled in a gap area between the one surface of the wiring board 2 and the principal surface of the semiconductor chip 3 is formed by epoxy thermosetting resin to which, for example, a silica filler, a hardening accelerator, a coupling agent and other materials are added. As the mechanical strength of the resin 5 can compensate for the mechanical strength of the bump electrodes 4 by filling the resin 5 in a gap area between the one surface of the wiring board 2 and the principal surface of the semiconductor chip 3, the damage to the bump electrodes caused by a difference in thermal expansion coefficient between the wiring board 2 and the semiconductor chip 3 can be prevented.

A plate member 7 is arranged on the rear surface opposite to the principal surface of the semiconductor chip 3 and a fixing area on one surface of the plate member 7 opposite to the rear surface of the semiconductor chip 3 is fixed on the rear surface of the semiconductor chip 3 via solder 6.

The plane shape of the plate member 7 is square for example. The plate member 7 is formed in a larger plane size than that of the semiconductor chip 3. For example, the plate member 7 is formed in a plane size of 45 [mm] ×45 [mm]. The plate member 7 is also formed by aluminum nitride (AlN), the thermal conductivity of which is high. The plate member 7 made of aluminum nitride has a heat-proof temperature of 1,000° C. or more and a thermal expansion coefficient of approximately $4.1 \times 10^{-6}[1/°C.]$.

The solder 6 is made of metallic material with a lower melting point than that of the bump electrodes 4, for example a metallic material with a melting point of approximately 300° C. and composed of 90% by weight of Pb and 10% by weight of Sn.

A metallized layer 3B provided with wettability to the solder 6 is formed on the rear surface of the semiconductor chip 3. The metallized layer 3B is constituted by a laminated structure in which, for example, a nickel (Ni) film and a gold (Au) film are laminated in order on the rear surface of the semiconductor chip 3, though the structure of the metallized layer 3B is not limited to this structure.

A metallized layer 7A provided with wettability to the solder 6 is formed in the fixing area on the one surface of the above plate member 7. The metallized layer 7A is constituted by, for example, the same structure as that of the metallized layer 3B, though the structure of the metallized layer 7A is not limited to this structure.

Bump electrodes 8 are respectively fixed on the surface of the plural electrode pads 2B arranged on the rear surface of the wiring board 2. These bump electrodes 8 are formed by a metallic material with a lower melting point than that of the solder 6, for example a metallic material with a melting point of 183° C. and composed by 37% by weight of Pb and 63% by weight of Sn.

The remaining area other than the fixing area on the one surface of the plate member 7 is exposed to the outside. The rear surface and the side face of the plate member 7 are exposed to the outside. That is, as the overall plate member 7 except the fixing area on the one surface is exposed, the area in which the plate member 7 is exposed to the air is increased by expanding the plane size of the plate member 7, compared with that of the semiconductor chip 3.

Since the plate member 7 is formed with a larger outer dimension than that of the semiconductor chip 3, the area in which the plate member is exposed to the air is larger, compared with that of the semiconductor chip 3. The plate member 7 is also formed by aluminum nitride. The thermal conductivity of this plate member 7 made of aluminum nitride is high. The fixing area on the one surface of the plate member 7 is fixed on the rear surface of the semiconductor chip 3 via the solder 6. Thermal conductivity in which heat is transmitted from the semiconductor chip 3 to the plate member 7 is high in a part in which the rear surface of the semiconductor chip 3 and the one surface of the plate member 7 are fixed via the solder 6. Therefore, heat generated from the semiconductor chip 3 is efficiently transmitted from the semiconductor chip 3 to the plate member 7, the heat transmitted to the plate member 7 is efficiently diffused and the heat diffused in the plate member 7 is efficiently transmitted from the plate member 7 into the air.

Next, referring to FIGS. 2 to 5 (sectional views for explaining a manufacturing method), a method of manufacturing the above semiconductor device 1 will be described.

First, a wiring board 2 and a semiconductor chip 3 are prepared. A metallized layer 3B is formed on the rear surface of the semiconductor chip 3. Bump electrodes 4 are already fixed on the surface of external terminals 3A arranged on the principal surface of the semiconductor chip 3. The bump electrodes 4 are formed by a metallic material, for example with a melting point of approximately 320° C. and composed of 98.2% by weight of Pb and 1.8% by weight of Sn.

Next, the semiconductor chip 3 is mounted on one surface of the wiring board 2 and the bump electrodes 4 are arranged between the surfaces of electrode pads 2A arranged on the one surface of the wiring board 2 and surfaces of the external terminals 3A arranged on the principal surface of the semiconductor chip 3.

Next, heat treatment is applied and as shown in FIG. 2, the electrode pads 2A of the wiring board 2 and the external terminals 3A of the semiconductor chip 3 are fixed by the bump electrodes 4. The heat treatment is applied in the atmosphere of the temperature of, for example, approximately 350° C. In this process, the electrode pads 2A of the wiring board 2 and the external terminals 3A of the semiconductor chip 3 are electrically and mechanically connected via the bump electrodes 4, and the semiconductor chip 3 is mounted on one surface of the mounting board 2.

Next, as shown in FIG. 3, liquid resin 5 is filled in a gap area between the one surface of the wiring board 2 and the principal surface of the semiconductor chip 3.

Next, heat treatment is applied so as to harden the above liquid resin 5.

Next, a metallized layer 3B formed on the rear surface of the semiconductor chip 3 is fixed to the surface of a metallized layer 7A formed in a fixing area on the one surface of the plate member 7 via solder 6. The solder 6 is formed by a metallic material, for example with a melting point of approximately 300° C. and composed of 90% by weight of Pb and 10% by weight of Sn.

Next, heat treatment is applied and as shown in FIG. 4, the fixing area on the one surface of the plate member 7 and the rear surface of the semiconductor chip 3 are fixed by the solder 6. The heat treatment is applied in an atmosphere having a temperature of, for example, approximately 310° C. In this process, the one surface of the plate member 7 and the rear surface of the semiconductor chip 3 can be fixed by the solder 6 without melting the bump electrodes 4 because the solder 6 is formed by a metallic material with a lower melting point than that of the bump electrodes 4. As the metallized layer 3B provided with wettability to the solder 6 is formed on the rear surface of the semiconductor chip 3 and the metallized layer 7A provided with wettability to the solder 6 is formed on the fixing area of the one surface of the plate member 7, the rear surface of the semiconductor chip 3 and the fixing area on the one surface of the plate member 7 can be fixed by solder 6.

Next, bump electrodes 8 are supplied on the surface of electrode pads 2B arranged on the rear surface opposite to the one surface of the above wiring board 2 by a ball supplying method using a glass mask. The bump electrodes 8 are formed by a metallic material with a lower melting point than that of the solder 6, for example a metallic material with a melting point of 183° C. and composed of 37% by weight of Pb and 63% by weight of Sn.

Next, heat treatment is applied and as shown in FIG. 5, the bump electrodes 8 are fixed on the surface of the electrode pads 2B on the rear surface of the wiring board 2. The heat treatment is applied in an atmosphere having a temperature of, for example, approximately 200° C. In this process, the bump electrodes 8 can be fixed on the surfaces of the electrode pads 2B on the wiring board 2 without melting the solder 6 because the bump electrodes 8 are formed by a metallic material with a lower melting point than that of the solder 6. The semiconductor device 1 is substantially completed by the completion of this process.

Afterward, the semiconductor device 1 is shipped as a product. The semiconductor device 1 shipped as a product is mounted on one surface (the mounting surface) of a mounting board via the bump electrodes 8.

Next, referring to FIGS. 6 and 7 (sectional views for explaining a mounting method), a method of mounting the above semiconductor device 1 will be described.

First, the semiconductor device 1 is prepared. The bump electrodes 8 are already fixed on the surfaces of the electrode pads 2B arranged on the rear surface of the wiring board 2 of the semiconductor device 1.

Next, a radiating fin member 12 is fixed on the rear surface of the plate member 7 of the above semiconductor device 1 via an elastic layer 11. The radiating fin member 12 is formed in a larger plane size than that of the semiconductor chip 3, for example in the plane size of 45 [mm] ×45 [mm]. The radiating fin member 12 is formed by aluminum with high thermal conductivity or an alloy mainly formed by aluminum, or copper or an alloy mainly formed by copper. The radiating fin member 12 made of aluminum has a thermal expansion coefficient of approximately $23.1 \times 10^{-6}$ [1/° C.]. The radiating fin member 12 made of copper has a thermal expansion coefficient of approximately $16.5 \times 10^{-6}$ [1/° C.]. The elastic layer 11 is formed by elastic material with high thermal conductivity or by viscous material. For elastic material, silicone gel, a heat transmission sheet and the like are used. For viscous material, thermally conductive grease, a thermally conductive compound and others are used. This elastic layer 11 can absorb thermal stress generated due to a difference in thermal expansion coefficient between the plate member 7 and the radiating fin member 12.

Figure 6:
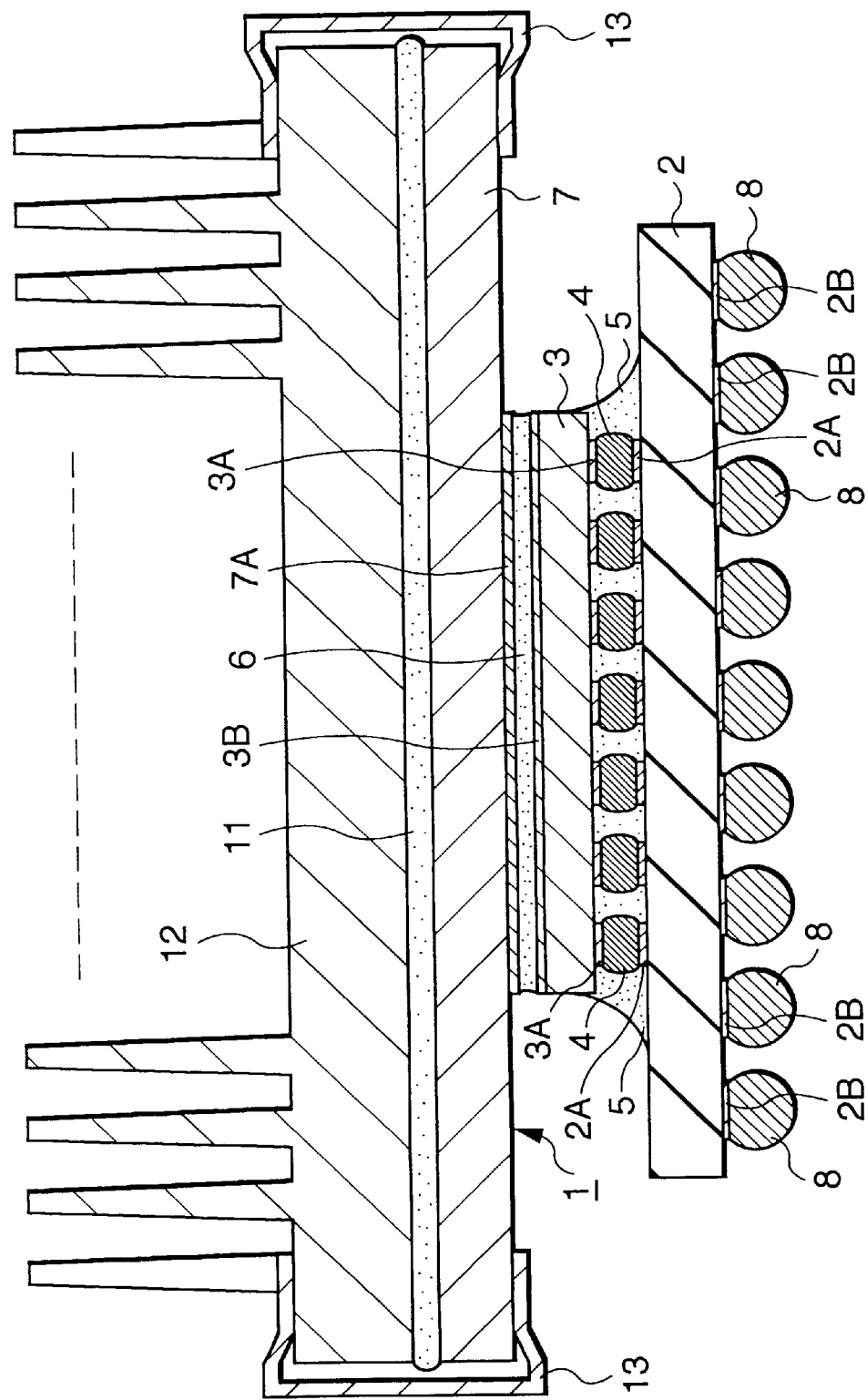
FIG. 6 is a sectional view for explaining a method of mounting the above semiconductor device.

Next, as shown in FIG. 6, the plate member 7 and the radiating fin member 12 of the above semiconductor device 1 are held and fixed by an elastic holding member 13. In this process, the radiating fin member 12 is stuck and fixed on the rear surface of the plate member 7 by the adhesive strength of the elastic layer 11; however, as the adhesive strength of the elastic layer 11 is weak, the fixing strength of the plate member 7 and the radiating fin member 12 can be increased by holding and fixing the plate member 7 and the radiating fin member 12 by the elastic holding member 13.

Next, the semiconductor device 1 is mounted on one surface (the mounting surface) of the mounting board 10 and the bump electrodes 8 are arranged between electrode pads 10A arranged on one surface of the mounting board 10 and the electrode pads 2B arranged on the rear surface of the wiring board 2 of the semiconductor device 1.

Figure 7:
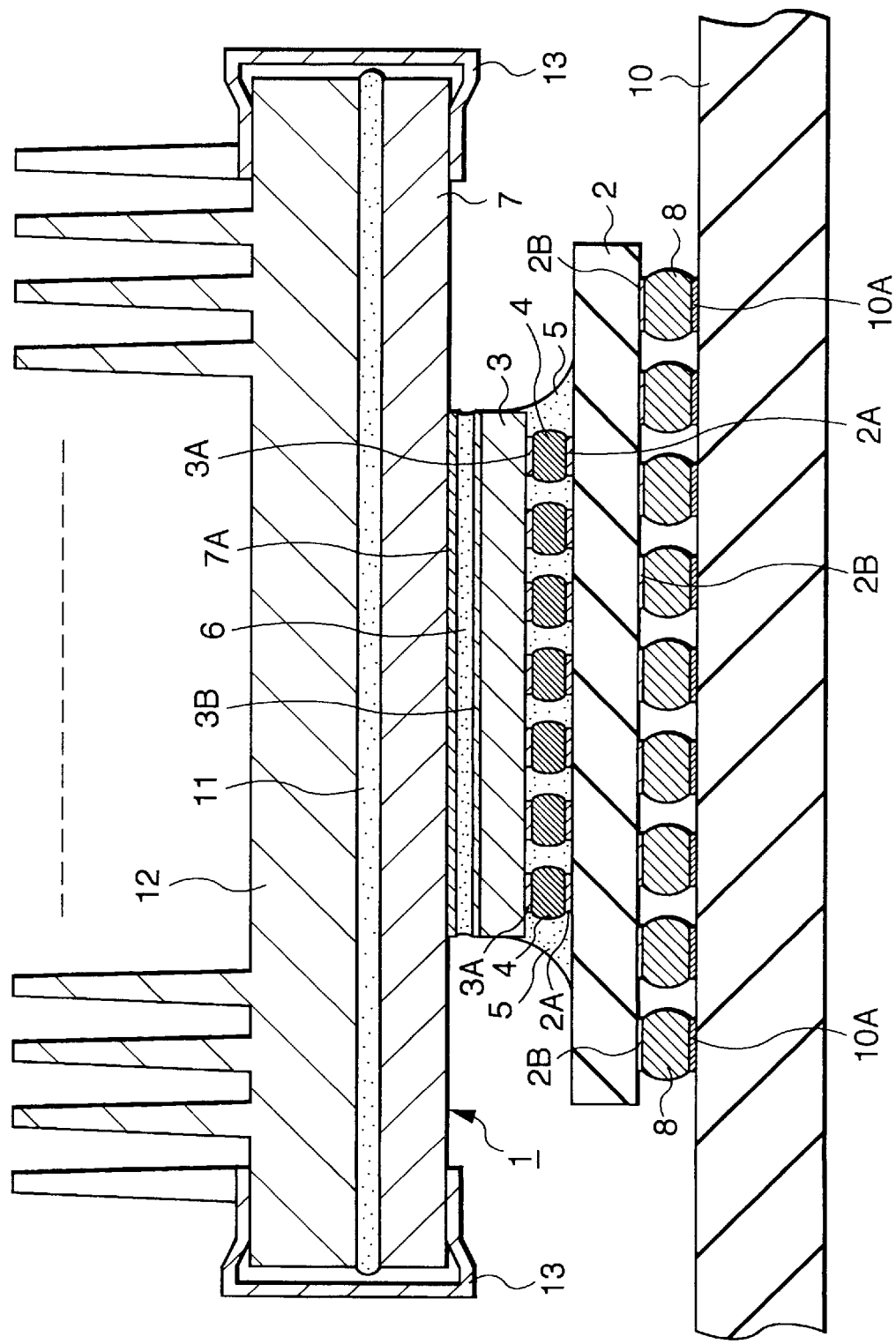
FIG. 7 is a sectional view for explaining a method of mounting the above semiconductor device.

Next, heat treatment is applied and as shown in FIG. 7, the electrode pads 10A of the mounting board 10 and the electrode pads 2B of the wiring board 2 are fixed by the bump electrodes 8. The heat treatment is applied in an atmosphere having a temperature of, for example, approximately 200° C. In this process, as the bump electrodes 8 are formed by a metallic material with a lower melting point than that of the solder 6, the electrode pads 10A of the mounting board 10 and the electrode pads 2B of the wiring board 2 can be fixed by the bump electrodes 8 without melting the solder 6. The semiconductor device 1 is mounted on the one surface of the mounting board 10 via the bump electrodes 8 by this process. A packaging structure (an electronic device) in which the radiating fin member 12 is fixed is also constituted on the rear surface opposite to one surface of the plate member 7 of the semiconductor device 1 via the elastic layer 11 by this process.

As described above, according to this embodiment, the following action and effect can be obtained.

(1) In a semiconductor device provided with a package structure in which a semiconductor chip 3 is mounted on one surface of a wiring board 2 via bump electrodes 4 and resin 5 is filled in a gap area between the one surface of the wiring board 2 and the principal surface of the semiconductor chip 3, a plate member 7 formed in a larger plane size than that of the semiconductor chip 3 and made of aluminum nitride is arranged on the rear surface opposite to the principal surface of the semiconductor chip 3, and a fixing area on the one surface of the plate member 7 opposite to the rear surface of the semiconductor chip 3 is fixed on the rear surface of the semiconductor chip 3 via solder 6.

Owing to this constitution, the area in which the plate member 7 is exposed to the air is larger than that of the semiconductor chip 3. The thermal conductivity of the plate member 7 made of aluminum nitride is high. The thermal conductivity in which heat is transmitted from the semiconductor chip 3 to the plate member 7 is high in an area in which the rear surface of the semiconductor chip 3 and one surface of the plate member 7 via the solder 6 are fixed. Therefore, as heat generated from the semiconductor chip 3 is efficiently transmitted from the semiconductor chip 3 to the plate member 7, the heat transmitted to the plate member 7 is efficiently diffused, and the heat diffused in the plate member 7 is efficiently transmitted from the plate member 7 into the air, the efficiency of heat radiation in which heat generated from the semiconductor chip 3 is radiated into the air can be enhanced.

As the area other than the fixing area in which the plate member is fixed on the rear surface of the semiconductor chip 3 on one surface of the plate member 7 is exposed, the area in which the plate member 7 is exposed to the air can be increased, compared with a case that the plate member 7 is fixed on the wiring board and a case that the plate member 7 is fixed on a package.

As the difference in thermal expansion coefficient between the plate member 7 made of aluminum nitride and the semiconductor chip 3 consisting of a silicon substrate is small, thermal stress generated due to the difference in thermal expansion coefficient between the plate member 7 and the semiconductor chip 3 can be prevented from being generated even if the plate member 7 is fixed on the rear surface of the semiconductor chip 3 via the solder 6.

(2) Metallized layers 3B and 7A provided with wettability to the solder 6 are formed on the rear surface of the semiconductor chip 3 and in the fixing area on one surface of the plate member 7. As the plate member 7 made of aluminum nitride can be fixed on the rear surface of the semiconductor chip 3 consisting of a silicon substrate by the solder 6 owing to this constitution, the fixing strength of the semiconductor chip 3 and the plate member 7 can be enhanced.

(3) The solder 6 is formed by a metallic material with a lower melting point than that of the bump electrodes 4. Owing to this constitution, the fixing area on the one surface of the plate member 7 can be fixed on the rear surface of the semiconductor chip 3 mounted on one surface of the wiring board 2 via the bump electrodes 4 without melting the bump electrodes 4.

(4) The bump electrodes 8 are formed by a metallic material with a lower melting point than that of the solder 6. Owing to this constitution., the semiconductor device 1 can be mounted on one surface of the mounting board 10 via the bump electrodes 8 without melting the solder 6.

(5) The method of mounting the semiconductor device on one surface of the mounting board 10 includes a process for preparing the semiconductor device 1 provided with a package structure in which the semiconductor chip 3 is mounted on one surface of the wiring board 2 via the bump electrodes 4, and resin 5 is filled in a gap area between the one surface of the wiring board 2 and the principal surface of the semiconductor chip 3, wherein further, the aluminum nitride plate member 7 formed in a larger plane size than that of the semiconductor chip is arranged on the rear surface opposite to the principal surface of the semiconductor chip 3, and the fixing area on one surface of the plate member 7 opposite to the rear surface of the semiconductor chip 3 is fixed on the rear surface of the semiconductor chip 3 via the solder 6; a process for fixing the radiating fin member 12 on the rear surface opposite to one surface of the plate member 7 via the elastic layer; and a process for mounting the semiconductor device 1 on one surface of the mounting board 10 via the bump electrodes 8.

Hereby, as thermal stress generated due to a difference in thermal expansion coefficient between the plate member 7 of the semiconductor device 1 and the radiating fin member 12 can be absorbed by the elastic layer 11 when the semiconductor device 1 is mounted on one surface of the mounting board 10 via the bump electrodes 8, the semiconductor device 1 can be mounted on one surface of the mounting board 10 with the radiating fin member made of metallic material with a large thermal expansion coefficient, for example aluminum or copper fixed on the rear surface of the plate member 7.

As the plate member 7 is formed in a larger plane size than that of the semiconductor chip 3, the heat radiating member 12 formed in a larger plane size than that of the semiconductor chip 3 can be stably fixed on the rear surface of the plate member 7.

Figure 8:
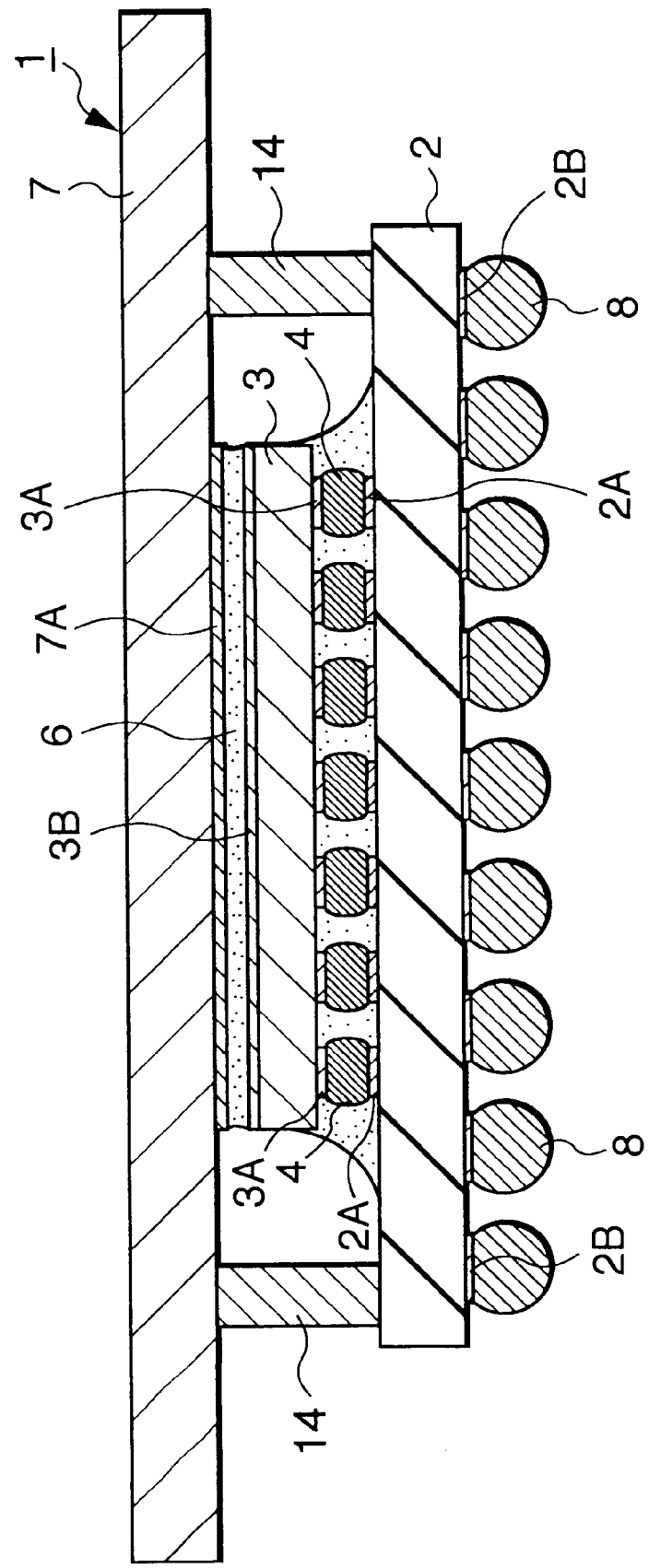
FIG. 8 is a sectional view showing a semiconductor device equivalent to a first modification according to the present invention.

As shown in the sectional view of FIG. 8, the semiconductor device 1 may be also constituted so that it is provided with structure in which a supporting member 14 for supporting the plate member 7 is provided between the wiring board 2 and the plate member 7. In this case, the plate member 7 with a larger plane size can be stably mounted on the rear surface of the semiconductor chip 3 with a smaller plane size.

Figure 9:
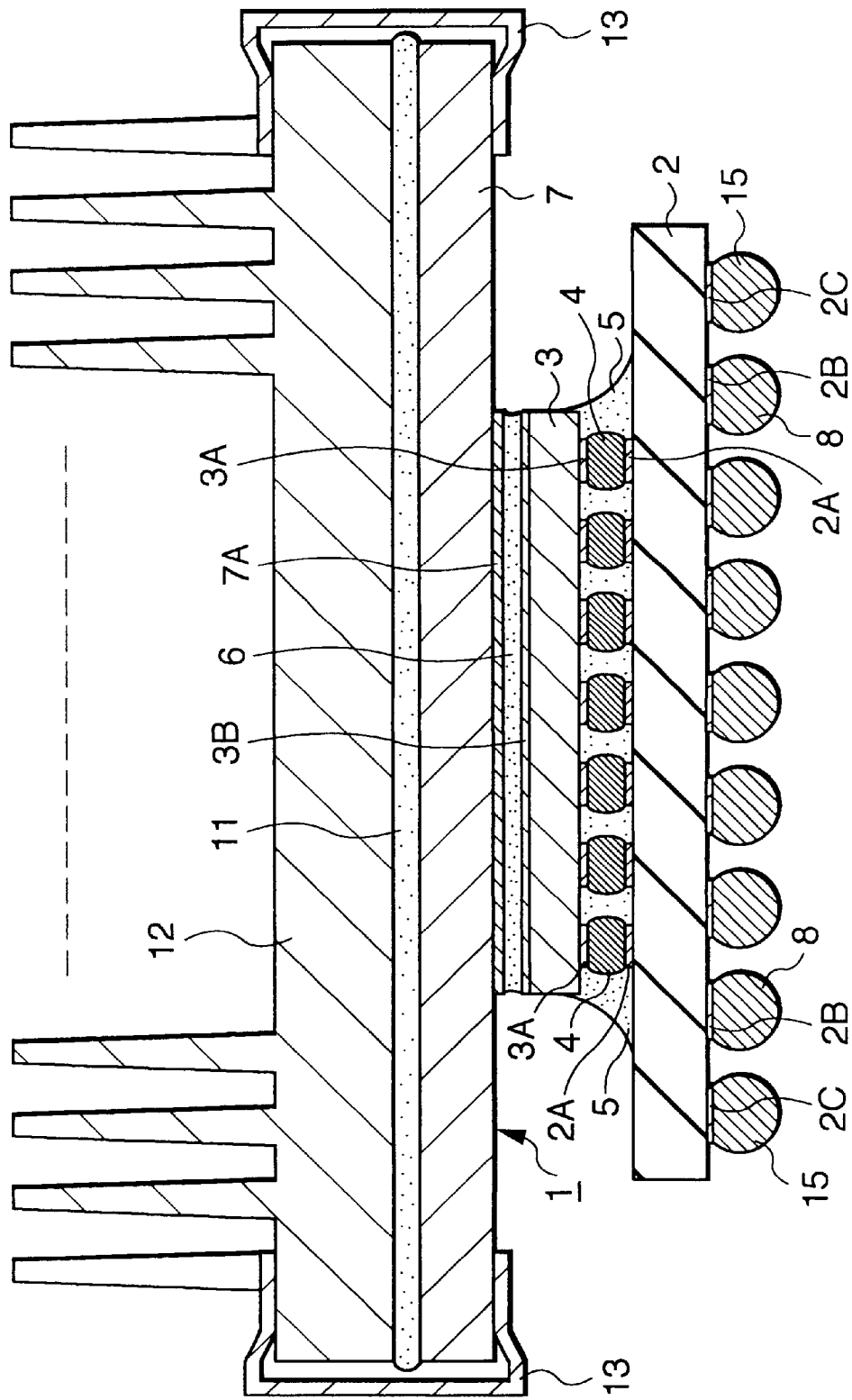
FIG. 9 is a sectional view showing a semiconductor device equivalent to a second modification according to the present invention.

As shown in the sectional view of FIG. 9, the semiconductor device 1 may be also constituted so that it is provided with a structure in which the radiating fin member 12 is fixed on the rear surface of the plate member 7 via the elastic layer 11 before the semiconductor device 1 is mounted on the mounting board 10.

As shown in FIG. 9, the semiconductor device 1 may be also constituted so that it is provided with a structure in which the plate member 7 and the radiating fin member 12 are held and fixed by the elastic holding member 13. In this case, as the fixing strength between the plate member 7 and the radiating fin member 12 can be increased, the radiating fin member 12 can be prevented from falling in transportation and storage.

As shown in FIG. 9, the semiconductor device 1 may be also constituted so that it is provided with a structure in which pads 2C are arranged on the rear surface of the wiring board 2 and supporting bumps 15 formed by a metallic material with a lower melting point than that of the solder 6 and a higher melting point than that of the bump electrodes 8 and set to the same height as the bump electrodes 8 or lower are fixed on the surface of the pads 2C. In this case, as the bump electrodes 8 can be melted, supporting the semiconductor device 1 by the supporting bumps 15 when the semiconductor device 1 is mounted on one surface of the mounting board 10 via the bump electrodes 8, the bump electrodes 8 are never crushed lower than the height of the supporting bumps 15 even if the weight of the semiconductor device 1 is increased by the plate member 7 and the radiating fin member 12. Therefore, the height of the bump electrodes 8 can be controlled by that of the supporting bumps 15.

Next, referring to FIGS. 13 to 19 (sectional views and a plan for explaining a manufacturing method), a method of manufacturing the semiconductor device 1 shown in FIG. 9 will be described.

First, a wiring board 2 and a semiconductor chip 3 are prepared. A metallized layer 3B is formed on the rear surface of the semiconductor chip 3. Bump electrodes 4 are already formed in the process of a wafer on the surface of external terminals 3A arranged on the principal surface of the semiconductor chip 3. The bump electrodes 4 are formed by a metallic material with a melting point of, for example, approximately 320 to 325° C. and composed of 98.2% by weight of Pb and 1.8% by weight of Sn.

Figure 13:
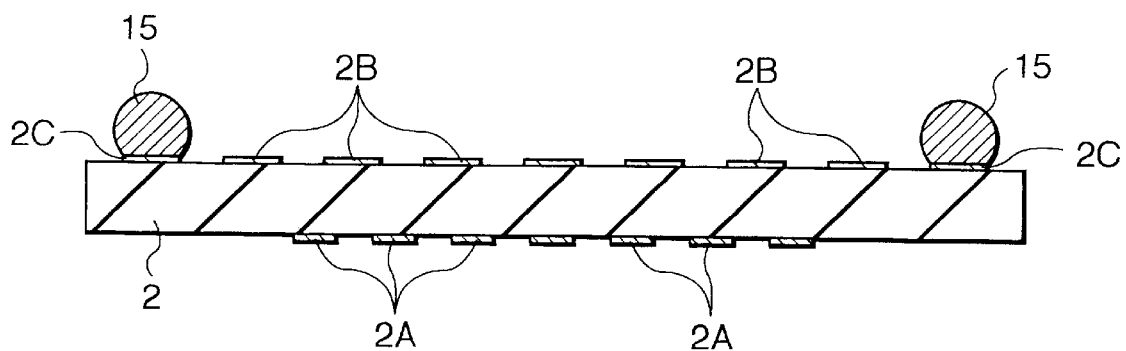
FIG. 13 is a sectional view viewed along a line A—A in FIG. 14.
Figure 14:
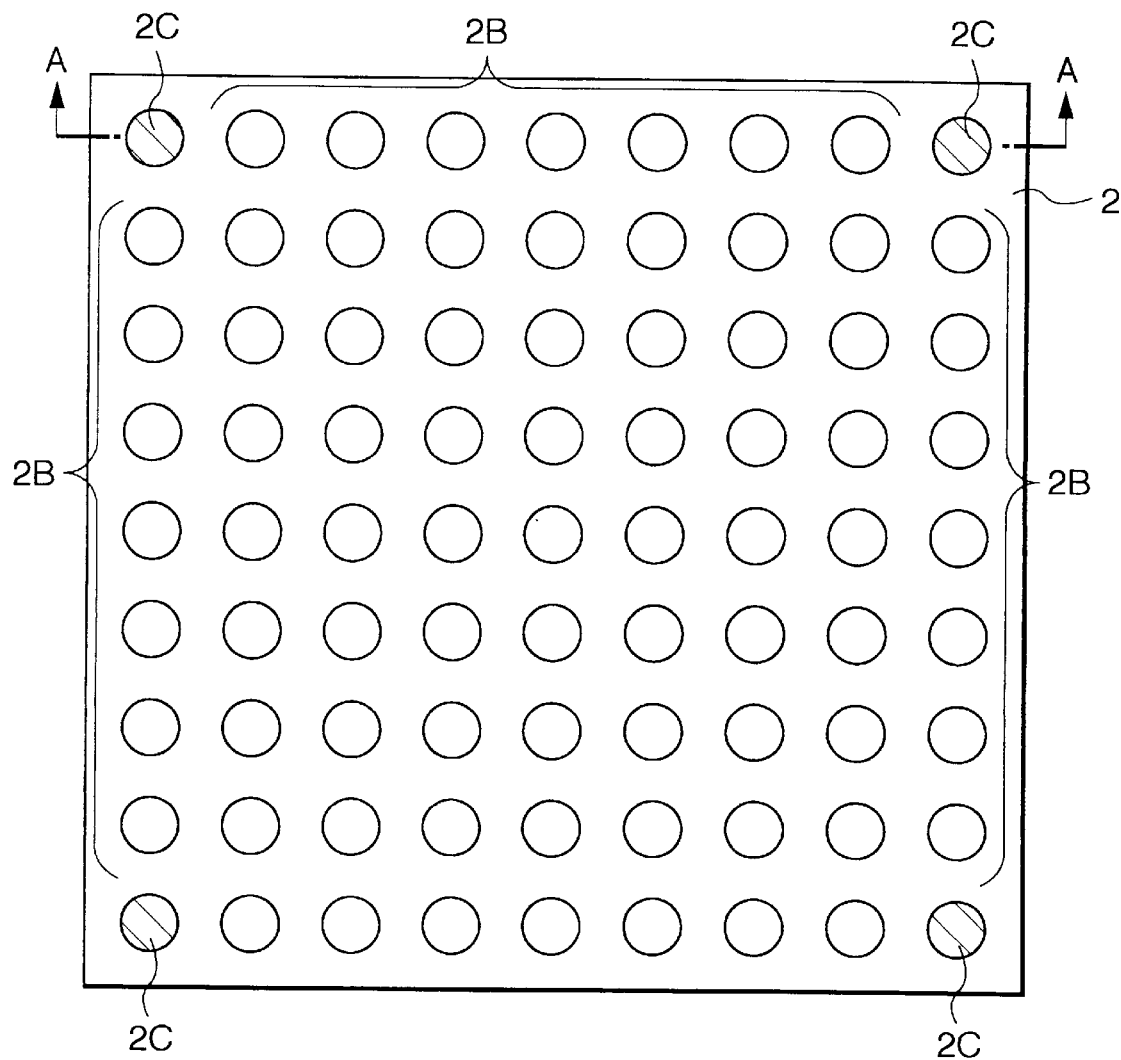
FIG. 14 is a plan for explaining a method of manufacturing the semiconductor device shown in FIG. 9.

Next, as shown in FIG. 13, bump electrodes 15 for a spacer are formed on the pads 2C on the wiring board 2. These bump electrodes 15 are formed on the pads 2C respectively arranged at four corners of the board 2 as shown in FIG. 14. The bump electrodes 15 are formed by solder with a melting point of, for example, approximately 320° C., and composed of 95% by weight of Pb and 5% by weight of Sn. The bump electrodes 15 are fixed on the pads 2C by a heat treatment of approximately 345° C. The bump electrodes 15 and the pads 2C are dummy terminals not electrically connected to the chip 3.

Figure 15:
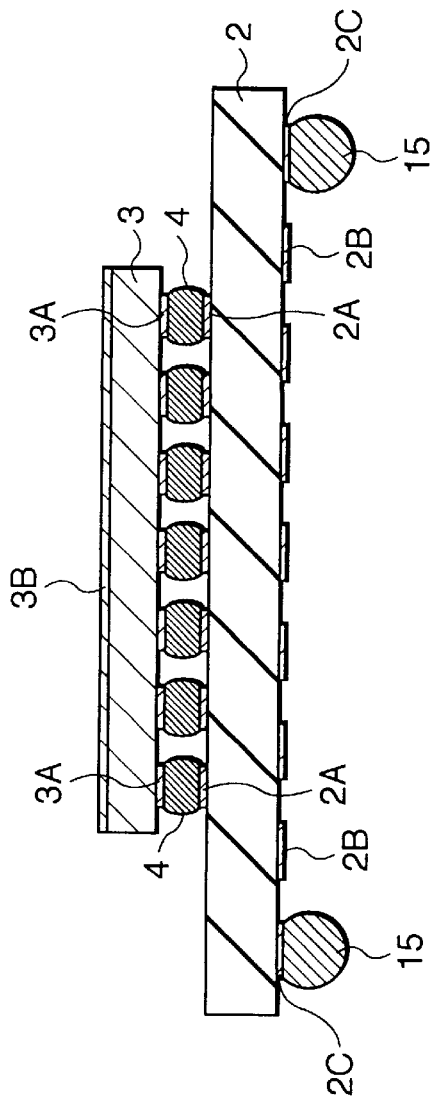
FIGS. 15 to 18 are sectional views for explaining a method of manufacturing the semiconductor device shown in FIG. 9.

Next, as shown in FIG. 15, the semiconductor chip 3 is mounted on one surface of the wiring board 2 and the bump electrodes 4 are arranged between the surface of electrode pads 2A arranged on the one surface of the wiring board 2 and the surface of the external terminals 3A arranged on the principal surface of the semiconductor chip 3.

Next, heat treatment is applied and the electrode pads 2A of the wiring board 2 and the external terminals 3A of the semiconductor chip 3 are fixed by the bump electrodes 4. The heat treatment is applied in an atmosphere having a temperature of, for example, approximately 350° C. In this process, the electrode pads 2A of the wiring board 2 and the external terminals 3A of the semiconductor chip 3 are electrically and mechanically connected via the bump electrodes 4 and the semiconductor chip 3 is mounted on one surface of the wiring board 2. The bump electrodes 15 are melted by this heat treatment; however, they never fall from the pads 2C owing to surface tension. Even if the bump electrodes 15 are damaged in the processing of the board 2, they can be recovered by this heat treatment.

The reason why the chip 3 is mounted after the bump electrodes 15 are formed is that an extra heat history should be prevented from being applied to the chip 3.

Next, the metallized layer 3B formed on the rear surface of the semiconductor chip 3 is fixed on the surface of a metallized layer 7A formed on a fixing area on one surface of the plate member 7 via solder 6. The solder 6 is formed by a metallic material with a melting point of, for example, approximately 300° C. and composed of 90% by weight of Pb and 10% by weight of Sn.

Figure 16:
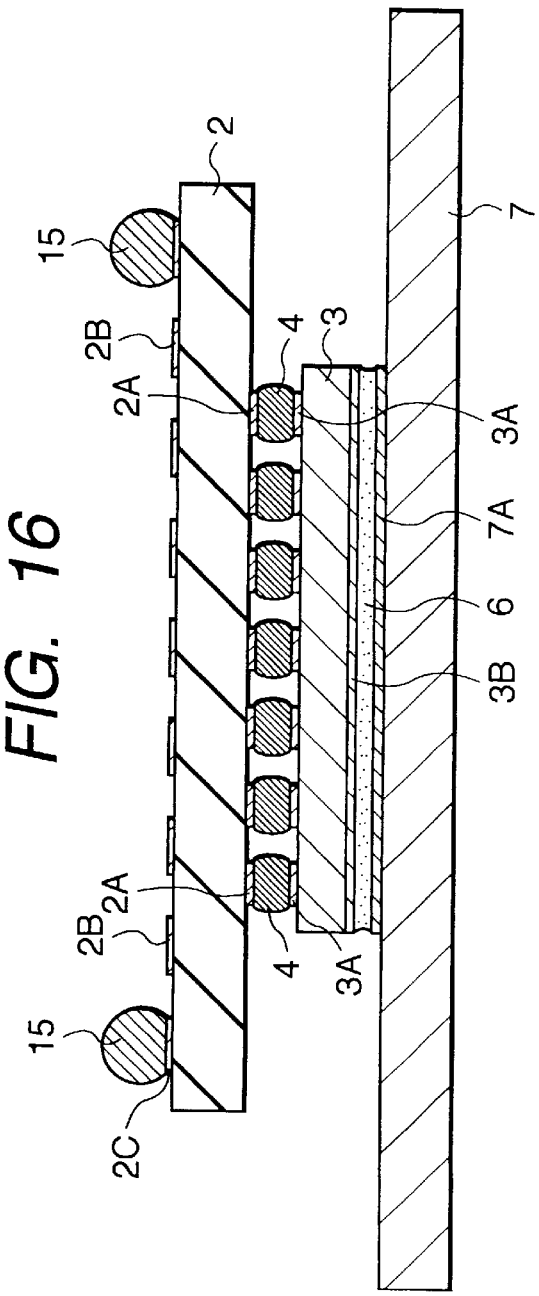

Next, heat treatment is applied and as shown in FIG. 16, the fixing area on one surface of the plate member 7 and the rear surface of the semiconductor chip 3 are fixed by the solder 6. The heat treatment is applied in an atmosphere having a temperature of, for example, approximately 310° C. In this process, one surface of the plate member 7 and the rear surface of the semiconductor chip 3 can be fixed by the solder 6 by melting the bump electrodes 4 because the solder 6 is formed by a metallic material with a lower melting point than that of the bump electrodes 4. As the metallized layer 3B provided with wettability to the solder 6 is formed on the rear surface of the semiconductor chip 3 and the metallized layer 7A provided with wettability to the solder 6 is formed on the fixing area on one surface of the plate member 7, the rear surface of the semiconductor chip 3 and the fixing area on the one surface of the plate member 7 can be fixed by the solder 6.

Figure 17:
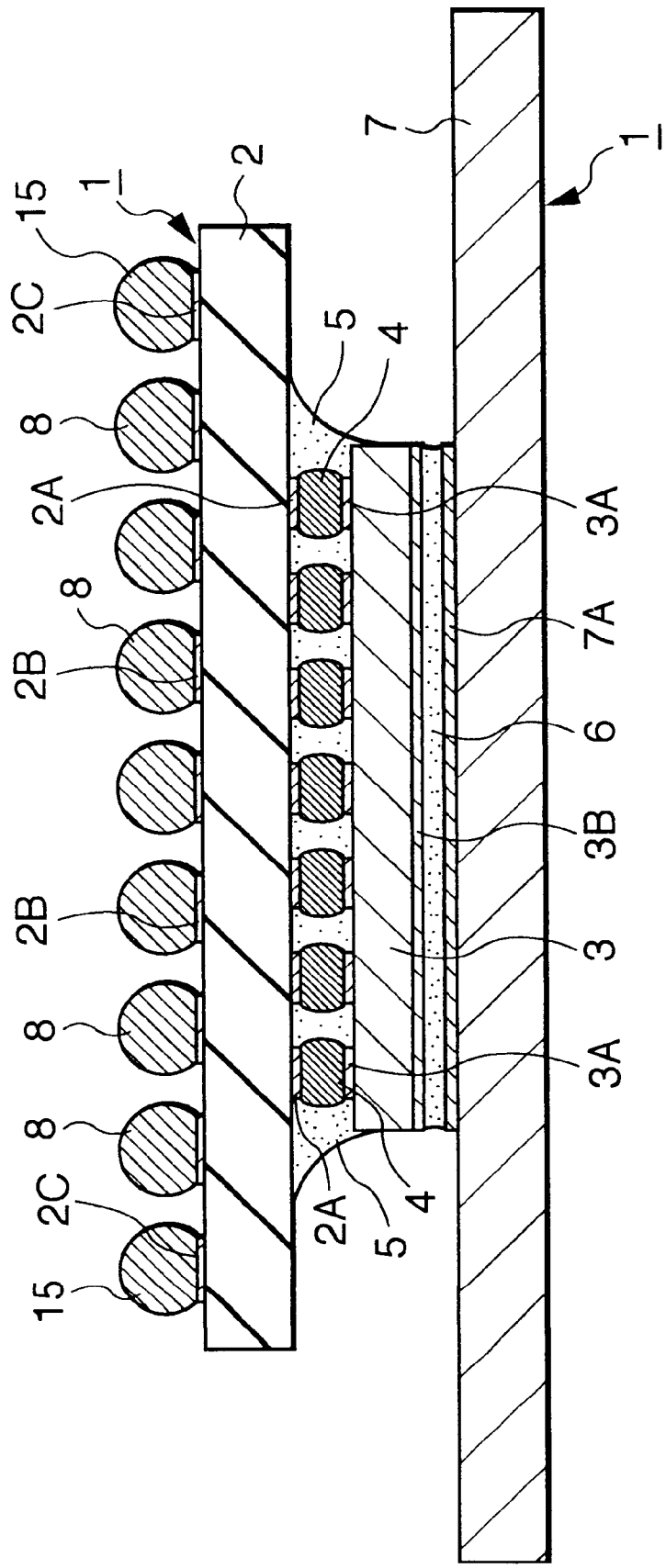

Next, as shown in FIG. 17, bump electrodes 8 are supplied on the surface of electrode pads 2B arranged on the rear surface opposite to one surface of the wiring board 2 by a ball supplying method using a glass mask. The bump electrodes 8 are formed by a metallic material with a lower melting point than that of the solder 6 and composed of 37% by weight of Pb with a melting point of 183° C. for example and 63% by weight of Sn.

Next, heat treatment is applied and the bump electrodes 8 for a signal and a power source are fixed on the surface of the electrode pads 2B on the rear surface of the wiring board 2. The heat treatment is applied in an atmosphere having a temperature of, for example, approximately 200° C. In this process, as the bump electrodes 8 are formed by a metallic material with a lower melting point than that of the solder 6, the bump electrodes 8 can be fixed on the surface of the electrode pads 2B on the wiring board 2 without melting the solder 6. The height of the bump electrodes 15 is formed so that it is lower than that of the bump electrodes 8. The height of the bump electrodes 15 is set to approximately 400 $\mu$m for example and that of the bump electrodes 8 is set to approximately 750 $\mu$m for example.

Next, a sealant 5 such as epoxy resin is filled between the board 2 and the chip 3. This sealant 5 is baked and hardened by a heat treatment of approximately 150° C. for example.

Figure 18:
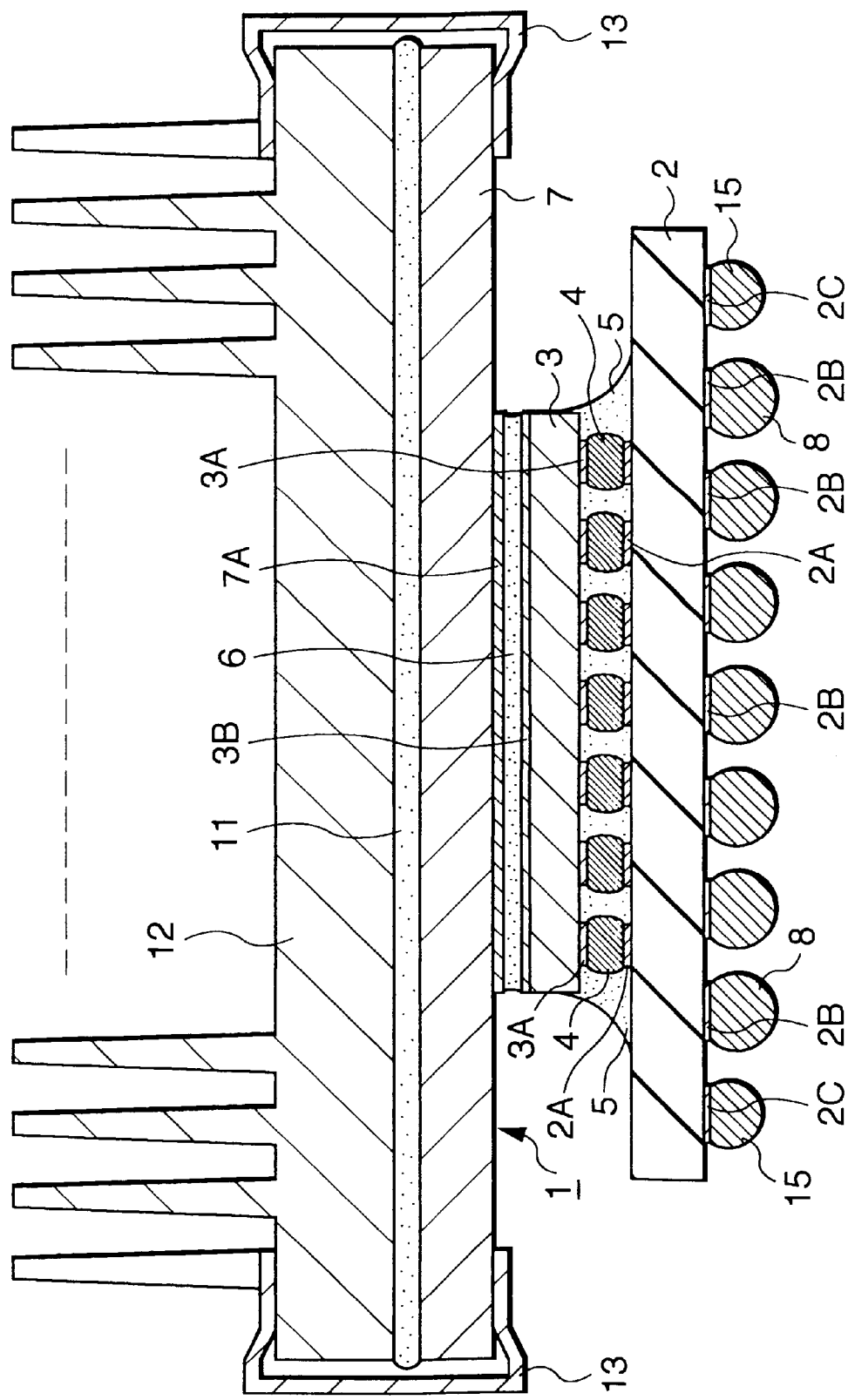

Next, as shown in FIG. 18, a radiating fin member 12 is fixed on the rear surface of the plate member 7 of the semiconductor device 1 via an elastic layer 11. The radiating fin member 12 is formed in a larger plane size than that of the semiconductor chip 3, for example in the plane size of 45 [mm]×45 [mm]. The radiating fin member 12 is formed by aluminum with high thermal conductivity or an alloy mainly constituted by aluminum, or copper or an alloy mainly constituted by copper. The radiating fin member 12 made of aluminum has a thermal expansion coefficient of approximately 23.1×10$^{-6}$[1/° C.]. The radiating fin member 12 made of copper has a thermal expansion coefficient of approximately 16.5×10$^{-6}$[1/° C.] . The elastic layer 11 is formed by elastic material or viscous material respectively with high thermal conductivity. For the elastic material, silicone gel, a thermally conductive sheet and others are used. For the viscous material, thermally conductive grease, a thermally conductive compound and others are used. This elastic layer 11 can absorb thermal stress generated due to a difference in thermal expansion coefficient between the plate member 7 and the radiating fin member 12.

Next, the plate member 7 of the semiconductor device 1 and the radiating fin member 12 are held and fixed by an elastic holding member 13 such as a clip. In this process, as the adhesive strength of the elastic layer 11 is weak though the radiating fin member 12 is stuck and fixed on the rear surface of the plate member 7 by the adhesive strength of the elastic layer 11, the fixing strength of the plate member 7 and the radiating fin member 12 can be increased by holding and fixing the plate member 7 and the radiating fin member 12 by the elastic holding member 13.

Figure 19:
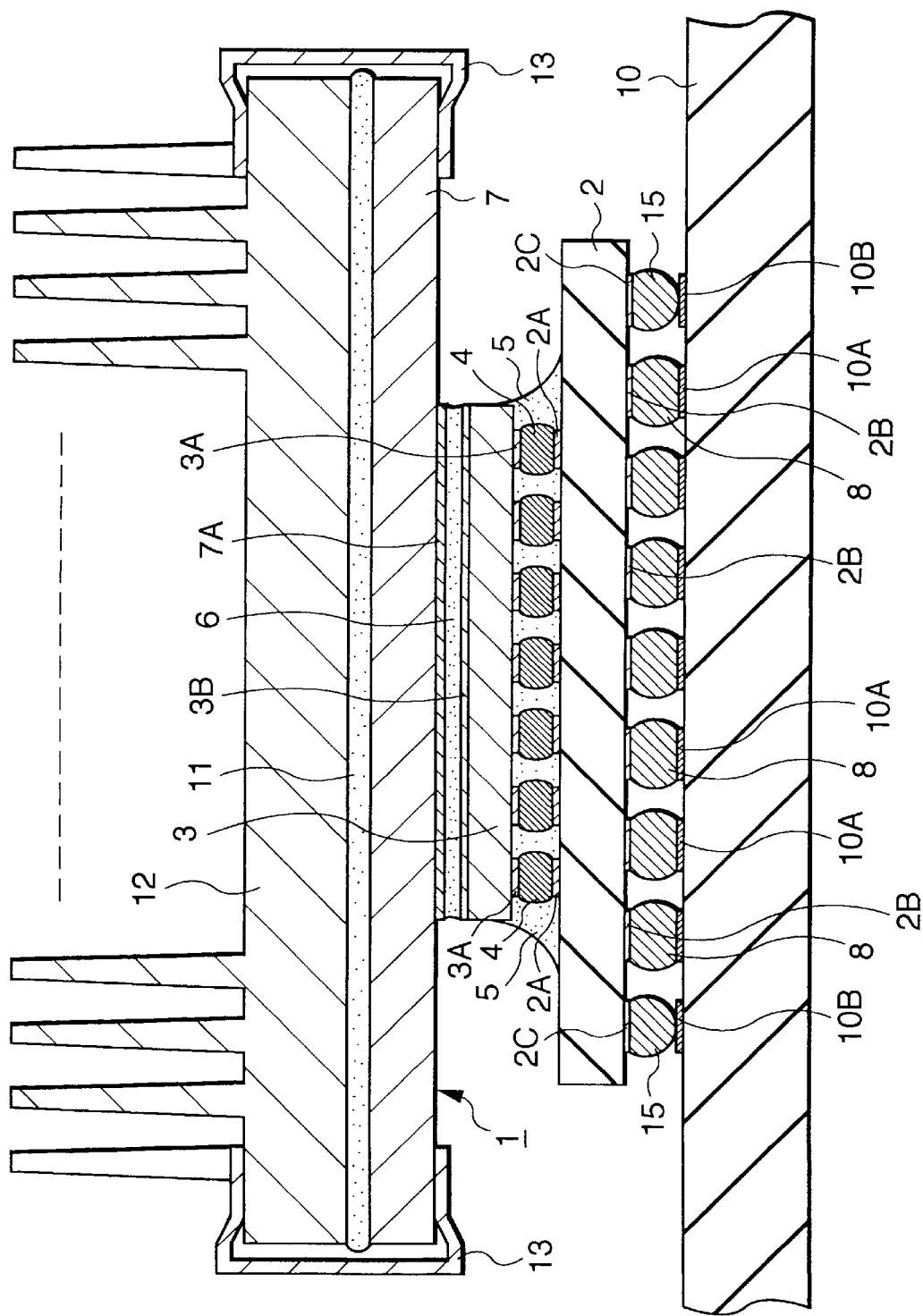
FIG. 19 is a sectional view for explaining a method of mounting the semiconductor device shown in FIG. 9.

Next, as shown in FIG. 19, the semiconductor device 1 is mounted on one surface (the mounting surface) of a mounting board 10, and the bump electrodes 8 and 15 are respectively arranged between electrode pads 10A and 10B arranged on the one surface of the mounting board 10 and the electrode pads 2B and 2C arranged on the rear surface of the wiring board 2 of the semiconductor device 1. For this mounting board 10, a multilayer wiring board such as a glass epoxy board (FR4) is used. The pads 10A are for a signal and a power source electrically connected to the chip 3, and the pads 10B are dummy terminals not electrically connected to the chip 3.

Next, heat treatment is applied and the electrode pads 10A on the mounting board 10 and the electrode pads 2B on the wiring board 2 are fixed by the bump electrodes 8. The heat treatment is applied in an atmosphere having a temperature of, for example, approximately 200° C. In this process, as the bump electrodes 8 are formed by a metallic material with a lower melting point than that of the solder 6 and the glass-transition temperature of a glass epoxy board (FR4), the electrode pads 10A on the mounting board 10 and the electrode pads 2B on the wiring board 2 can be fixed by the bump electrodes 8 without melting the solder 6 and by preventing the denaturation of the mounting board 10. At this time, as the bump electrodes 15 are not melted by this heat treatment, an interval between the mounting board 10 and the wiring board 2 can be precisely controlled owing to the height of the bump electrodes 15. Therefore, the bump electrodes 8 can be prevented from being crushed and a short circuit can be prevented from being generated. The semiconductor device 1 is mounted on one surface of the mounting board 10 via the bump electrodes 8 by this process. A packaging structure (an electronic device) in which the radiating fin member 12 is fixed on the rear surface opposite to one surface of the plate member 7 of the semiconductor device 1 via the elastic layer 11 is also constituted by this process.

Figure 10:
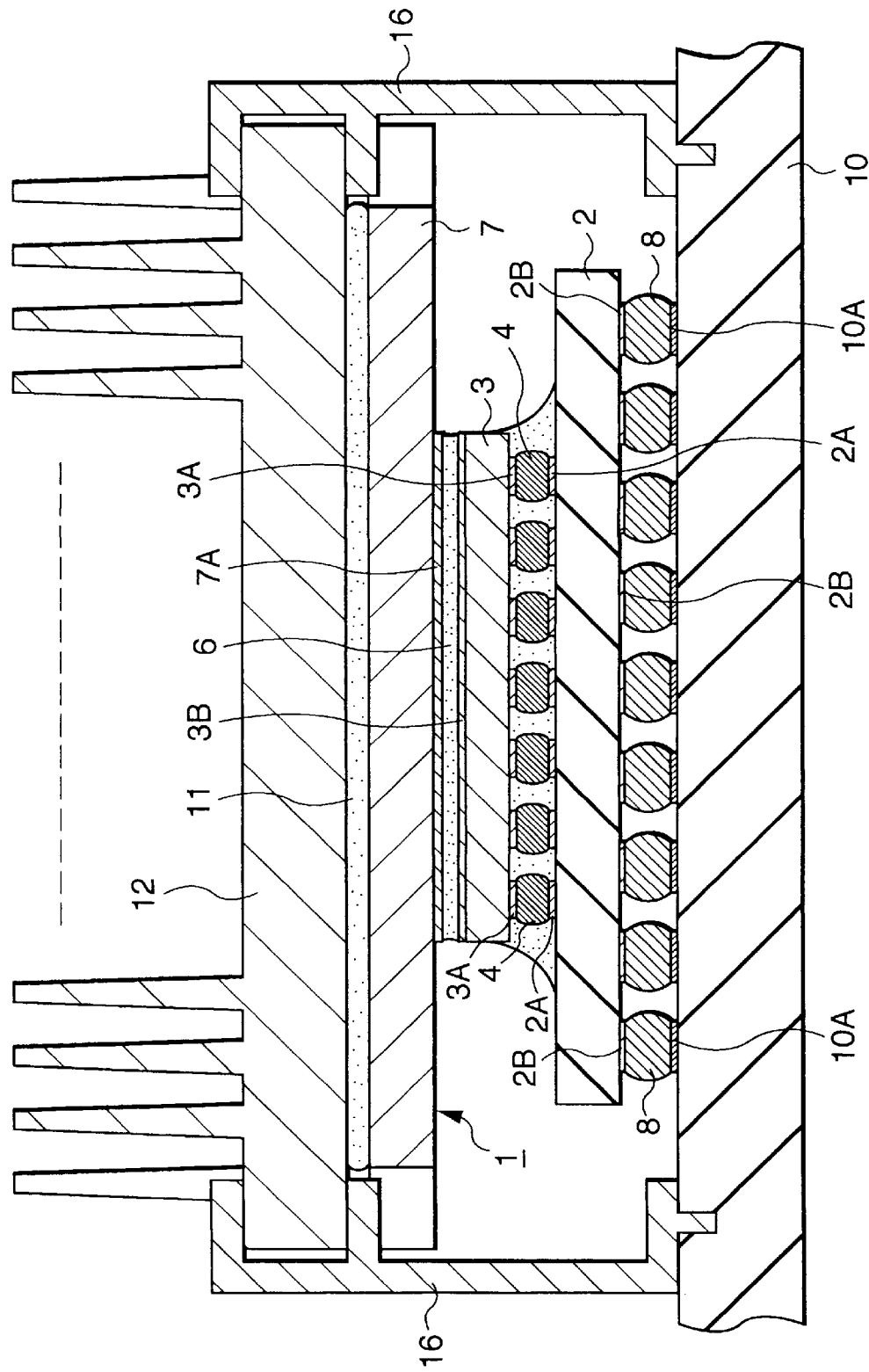
FIG. 10 is a sectional view showing a state in which a semiconductor device equivalent to a third modification according to the present invention is mounted.

In the mounting process of the semiconductor device 1, as shown in the sectional view of FIG. 10, the heat radiating member 12 may be also supported on the mounting board 10 via a supporting member 16. In this case, the radiating fin member 12 can be prevented from falling in the transportation and storage of the mounting board 10 after the semiconductor device 1 is mounted and in mounting in a cabinet. The load of the radiating fin member 12 can be also prevented from being applied to the bump electrodes 8. Hereby, the distortion of the bump electrodes 8 due to a difference in thermal expansion coefficient between the wiring board 2 and the mounting board 10 and further, distortion due to a load, can be prevented from being applied, and the reliability upon electrical connection of the bump electrodes 8 can be secured.

In the mounting process of the semiconductor device 1, the semiconductor device 1 may be mounted on one surface of the mounting board 10 via the bump electrodes 8 and afterward, the radiating fin member 12 may be also fixed on the rear surface of the plate member 7 of the semiconductor device 1 via the elastic layer 11. In this case, the deterioration of the elastic layer 11 by the heat generated in the heat treatment for melting the bump electrodes 8 can be prevented.

In the mounting process of the semiconductor device 1, a process in which the plate member 7 and the radiating fin member 12 are held and fixed by the holding member 13 may be also omitted.

Figure 11:
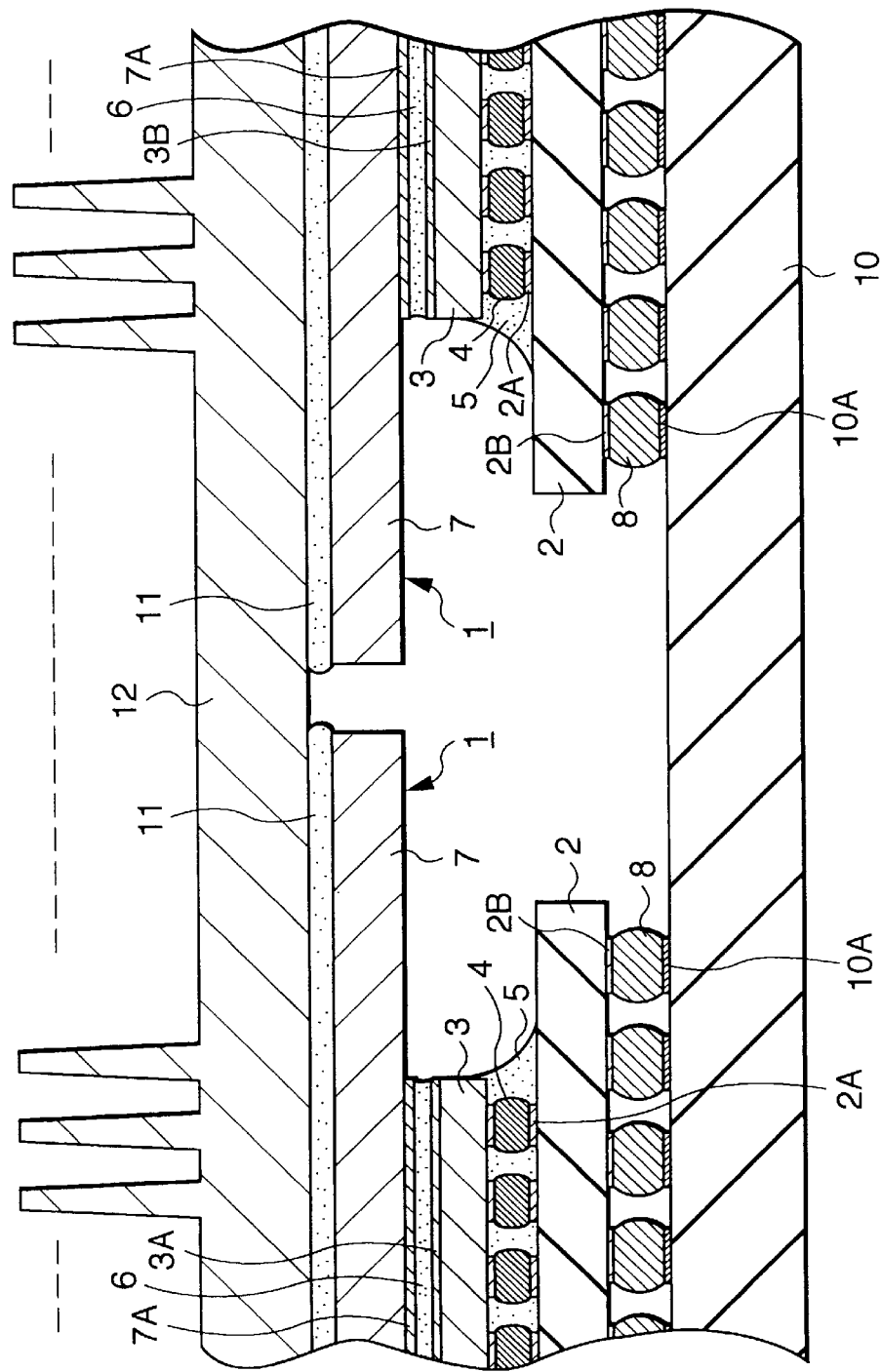
FIG. 11 is a sectional view showing a state in which a semiconductor device equivalent to a fourth modification according to the present invention is mounted.

As shown in the sectional view of FIG. 11, a radiating fin member 12 may be also provided each of plural semiconductor devices 1.

Figure 12:
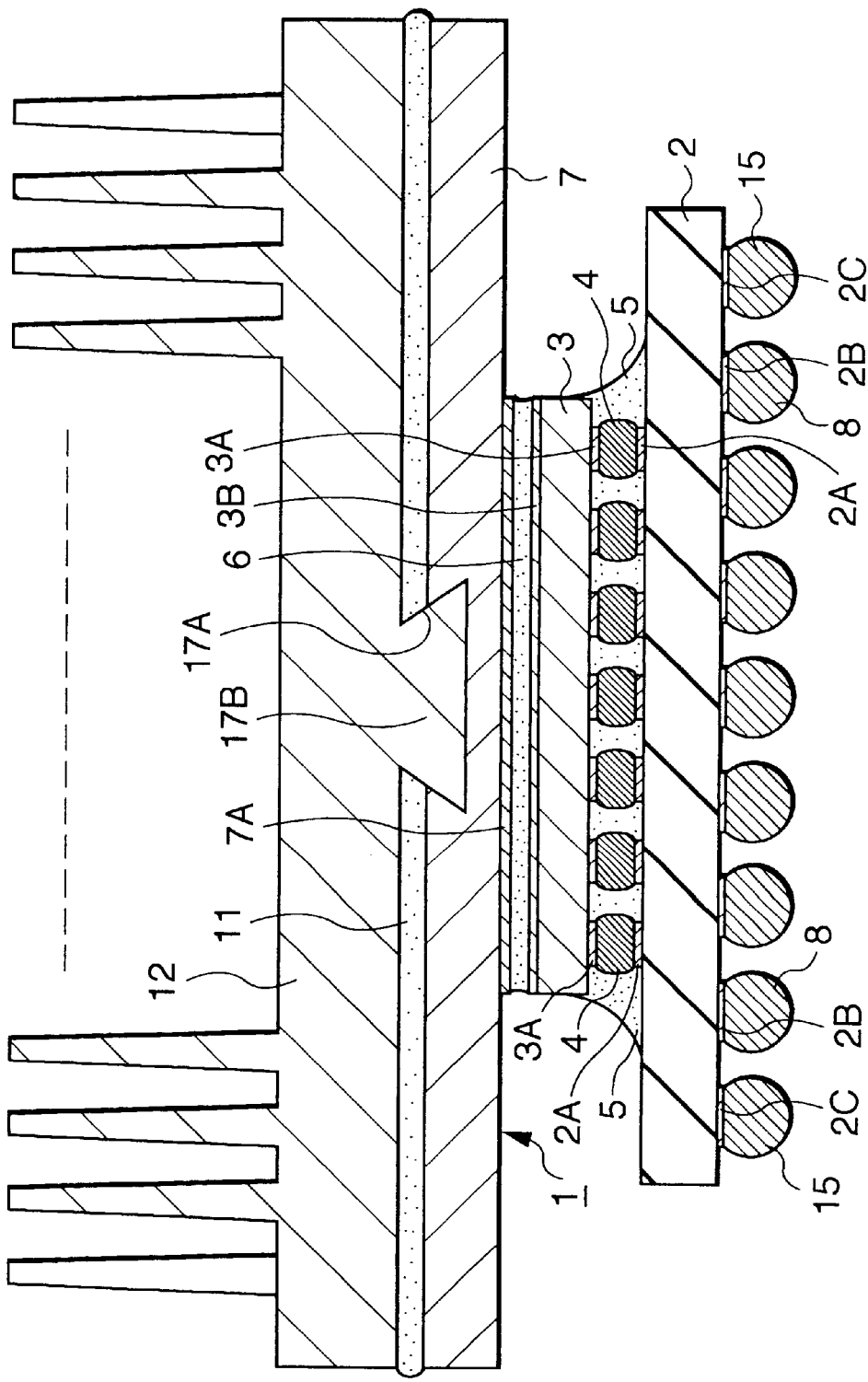
FIG. 12 is a sectional view showing a semiconductor device equivalent to a fifth modification according to the present invention.

As shown in the sectional view of FIG. 12, the plate member 7 and the radiating fin member 12 may be also provided with a constitution in which a groove 17A is provided on one side and a projection 17B for fitting to the groove 17A is provided on the other side. In this case, the plate member 7 and the radiating fin member 12 can be readily positioned.

As shown in FIG. 12, the groove 17A and the projection 17B may be also constituted in the shape of a dovetail groove. In this case, the radiating fin member 12 can be prevented from falling in transportation, storage and others.

The present invention made by the inventors has been described above concretely based upon the above embodiments; however, the present invention is not limited to the above embodiments and variations are allowed in a range from which the outline is not deviated.

What is claimed is:

1. A packaging structure, comprising:

a semiconductor device including a semiconductor chip mounted on one surface of a wiring board via first bump electrodes, and a plate member having a larger plane size than that of said semiconductor chip, a fixing area on one surface of said plate member being fixed on the rear surface opposite to the principal surface of said semiconductor chip via solder, and said wiring board being mounted on one surface of a mounting board via second bump electrodes;

a radiating fin member fixed on the rear surface opposite to said one surface of said plate member via an elastic layer; and supporting bumps, formed by a metallic material with a lower melting point than that of said solder and a higher melting point than that of said second bump electrodes, on the rear surface of said wiring board and set to the same or a lower height compared with that of said second bump electrodes.

2. A packaging structure according to claim 1, wherein one surface of said radiating fin member is supported by said mounting board via a supporting member, and is coupled to the rear surface of said plate member opposite to said one surface of said plate member via an elastic layer.

3. A packaging structure according to claim 2, further comprising:

resin filled in a gap area between the one surface of said wiring board and the principal surface of said semiconductor chip.

4. A semiconductor device according to claim 1, wherein said plate member comprises aluminum nitride.

* * * * *